United States Patent
Johnson et al.

(10) Patent No.: US 8,575,719 B2
(45) Date of Patent: *Nov. 5, 2013

(54) SILICON NITRIDE ANTIFUSE FOR USE IN DIODE-ANTIFUSE MEMORY ARRAYS

(75) Inventors: Mark G. Johnson, Los Altos, CA (US); N. Johan Knall, Sunnyvale, CA (US); S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 1882 days.

This patent is subject to a terminal disclaimer.

(21) Appl. No.: 10/610,804

(22) Filed: Jun. 30, 2003

(65) Prior Publication Data

US 2004/0016991 A1    Jan. 29, 2004

Related U.S. Application Data

(60) Continuation-in-part of application No. 10/153,999, filed on May 22, 2002, now Pat. No. 6,653,712, which is a division of application No. 09/814,727, filed on Mar. 21, 2001, now Pat. No. 6,420,215, which is a continuation-in-part of application No. 09/560,626, filed on Apr. 28, 2000, now abandoned.

(51) Int. Cl.
| | |
|---|---|
| H01L 23/52 | (2006.01) |
| H01L 29/04 | (2006.01) |
| H01L 29/10 | (2006.01) |
| H01L 31/036 | (2006.01) |

(52) U.S. Cl.
USPC .................. 257/530; 257/50; 257/E23.147

(58) Field of Classification Search
USPC .................. 257/50, 208, 209, 211, 529, 530, 257/E23.147; 438/131, 132, 467, 600, 601; 365/103, 225.7
See application file for complete search history.

(56) References Cited

U.S. PATENT DOCUMENTS

| | | | |
|---|---|---|---|
| 3,134,963 A | 5/1964 | Henle et al. | |
| 3,414,892 A | 12/1968 | McCormack et al. | |
| 3,432,827 A | 3/1969 | Sarno | |
| 3,452,334 A | 6/1969 | Voegeli | |
| 3,576,549 A | 4/1971 | Hess et al. | |
| 3,582,902 A | 6/1971 | Koo | |

(Continued)

FOREIGN PATENT DOCUMENTS

| | | |
|---|---|---|
| CN | 85108221 | 5/1987 |
| EP | 0 073 486 | 3/1983 |

(Continued)

OTHER PUBLICATIONS

Saeki et al., "A 2.5-ns Clock Access, 250-MHz, 256-Mb SDRAM with Synchronous Mirror Delay," IEEE Journal of Solid-State Circuits, vol. 31, No. 11, Nov. 1996, pp. 1656-1668.

(Continued)

*Primary Examiner* — Daniel Luke
(74) *Attorney, Agent, or Firm* — Dugan & Dugan, PC

(57) ABSTRACT

Silicon nitride antifuses can be advantageously used in memory arrays employing diode-antifuse cells. Silicon nitride antifuses can be ruptured faster and at a lower breakdown field than antifuses formed of other materials, such as silicon dioxide. Examples are given of monolithic three dimensional memory arrays using silicon nitride antifuses with memory cells disposed in rail-stacks and pillars, and including PN and Schottky diodes. Pairing a silicon nitride antifuse with a low-density, high-resistivity conductor gives even better device performance.

5 Claims, 5 Drawing Sheets

(56) References Cited

U.S. PATENT DOCUMENTS

| | | |
|---|---|---|
| 3,582,908 A | 6/1971 | Koo et al. |
| 3,634,929 A | 1/1972 | Yoshida et al. |
| 3,671,948 A | 6/1972 | Cassen et al. |
| 3,696,349 A | 10/1972 | Kaske et al. |
| 3,717,852 A | 2/1973 | Abbas et al. |
| 3,728,695 A | 4/1973 | Frohman-Bentchkowsky |
| 3,787,822 A | 1/1974 | Rioult |
| 3,863,231 A | 1/1975 | Taylor |
| 3,913,224 A | 10/1975 | Preissinger et al. |
| 3,990,098 A | 11/1976 | Mastrangelo |
| 4,146,902 A | 3/1979 | Tanimoto et al. |
| 4,203,123 A | 5/1980 | Shanks |
| 4,203,158 A | 5/1980 | Frohman-Bentchkowsky et al. |
| 4,229,757 A | 10/1980 | Moussie |
| 4,272,880 A | 6/1981 | Pashley |
| 4,281,397 A | 7/1981 | Neal et al. |
| 4,338,622 A | 7/1982 | Feth et al. |
| 4,417,325 A | 11/1983 | Harari et al. |
| 4,419,741 A | 12/1983 | Stewart et al. |
| 4,420,766 A | 12/1983 | Kasten |
| 4,425,379 A | 1/1984 | Vora et al. |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye et al. |
| 4,646,266 A | 2/1987 | Ovshinsky et al. |
| 4,672,577 A | 6/1987 | Hirose et al. |
| 4,677,742 A | 7/1987 | Johnson |
| 4,710,798 A | 12/1987 | Marcantonio |
| 4,796,234 A | 1/1989 | Itoh et al. |
| 4,811,082 A | 3/1989 | Jacobs et al. |
| 4,820,657 A | 4/1989 | Hughes et al. |
| 4,823,181 A | 4/1989 | Mohsen et al. |
| 4,845,669 A | 7/1989 | Chappell et al. |
| 4,855,903 A | 8/1989 | Carleton et al. |
| 4,855,953 A | 8/1989 | Tsukamoto et al. |
| 4,876,220 A | 10/1989 | Mohsen et al. |
| 4,881,114 A * | 11/1989 | Mohsen et al. ............... 257/530 |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,383 A | 12/1991 | Sinar et al. |
| 5,070,384 A | 12/1991 | McCollum et al. |
| 5,089,862 A | 2/1992 | Warner, Jr. et al. |
| 5,103,422 A | 4/1992 | Tokita et al. |
| 5,126,290 A | 6/1992 | Lowrey et al. |
| 5,160,987 A | 11/1992 | Pricer et al. |
| 5,191,405 A | 3/1993 | Tomita et al. |
| 5,197,025 A | 3/1993 | Schwee et al. |
| 5,202,754 A | 4/1993 | Bertin et al. |
| 5,233,206 A | 8/1993 | Lee et al. |
| 5,242,851 A | 9/1993 | Choi |
| 5,266,912 A | 11/1993 | Kledzik |
| 5,269,852 A | 12/1993 | Nishida |
| 5,283,468 A | 2/1994 | Kondo et al. |
| 5,287,000 A | 2/1994 | Takahashi et al. |
| 5,289,410 A | 2/1994 | Katti et al. |
| 5,296,716 A | 3/1994 | Ovshinsky et al. |
| 5,306,935 A | 4/1994 | Esquivel et al. |
| 5,311,039 A * | 5/1994 | Kimura et al. ............... 257/50 |
| 5,334,880 A | 8/1994 | Abadeer et al. |
| 5,391,518 A | 2/1995 | Bhushan |
| 5,391,917 A | 2/1995 | Gilmour et al. |
| 5,398,200 A | 3/1995 | Mazure et al. |
| 5,422,435 A | 6/1995 | Takiar et al. |
| 5,426,566 A | 6/1995 | Beilstein, Jr. et al. |
| 5,427,979 A | 6/1995 | Chang |
| 5,429,968 A | 7/1995 | Koyama |
| 5,434,745 A | 7/1995 | Shokrgozar et al. |
| 5,436,861 A | 7/1995 | Katti et al. |
| 5,441,907 A | 8/1995 | Sung et al. |
| 5,453,952 A | 9/1995 | Okudaira et al. |
| 5,455,445 A | 10/1995 | Kurtz et al. |
| 5,463,244 A | 10/1995 | De Araujo et al. |
| 5,467,305 A | 11/1995 | Bertin et al. |
| 5,468,997 A | 11/1995 | Imai et al. |
| 5,471,090 A | 11/1995 | Deutsch et al. |
| 5,481,133 A | 1/1996 | Hsu |
| 5,495,398 A | 2/1996 | Takiar et al. |
| 5,502,289 A | 3/1996 | Takiar et al. |
| 5,508,971 A | 4/1996 | Cernea et al. |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,539,839 A | 7/1996 | Bellegarda et al. |
| 5,539,893 A | 7/1996 | Thompson et al. |
| 5,552,963 A | 9/1996 | Burns |
| 5,561,315 A | 10/1996 | Van Dort |
| 5,561,622 A | 10/1996 | Bertin et al. |
| 5,578,836 A | 11/1996 | Husher et al. |
| 5,581,111 A | 12/1996 | Chen |
| 5,581,498 A | 12/1996 | Ludwig et al. |
| 5,585,675 A | 12/1996 | Knopf |
| 5,596,532 A | 1/1997 | Cernea et al. |
| 5,602,987 A | 2/1997 | Harari et al. |
| 5,612,570 A | 3/1997 | Eide et al. |
| 5,625,220 A | 4/1997 | Liu et al. |
| 5,640,343 A | 6/1997 | Gallagher et al. |
| 5,654,220 A | 8/1997 | Leedy |
| 5,666,304 A | 9/1997 | Hikawa et al. |
| 5,675,547 A | 10/1997 | Koga |
| 5,682,059 A * | 10/1997 | Yoshii et al. ............... 257/530 |
| 5,686,341 A | 11/1997 | Roesner |
| 5,691,933 A | 11/1997 | Takenaka |
| 5,693,552 A | 12/1997 | Hsu |
| 5,693,556 A | 12/1997 | Cleeves |
| 5,696,031 A | 12/1997 | Wark |
| 5,703,747 A | 12/1997 | Voldman et al. |
| 5,714,795 A | 2/1998 | Ohmi et al. |
| 5,726,484 A | 3/1998 | Hart et al. |
| 5,737,259 A | 4/1998 | Chang |
| 5,744,394 A | 4/1998 | Iguchi et al. |
| 5,745,407 A * | 4/1998 | Levy et al. ............... 365/159 |
| 5,751,012 A | 5/1998 | Wolstenholme et al. |
| 5,751,629 A | 5/1998 | Nova et al. |
| 5,763,299 A | 6/1998 | McCollum et al. |
| 5,776,810 A | 7/1998 | Guterman et al. |
| 5,780,346 A | 7/1998 | Arghavani et al. |
| 5,780,925 A | 7/1998 | Cipolla et al. |
| 5,781,031 A | 7/1998 | Bertin et al. |
| 5,793,697 A | 8/1998 | Scheuerlein |
| 5,801,437 A | 9/1998 | Burns |
| 5,818,748 A | 10/1998 | Bertin et al. |
| 5,831,325 A | 11/1998 | Zhang |
| 5,835,396 A * | 11/1998 | Zhang ............... 365/51 |
| 5,838,530 A | 11/1998 | Zhang |
| 5,854,534 A | 12/1998 | Beilin et al. |
| 5,866,938 A * | 2/1999 | Takagi et al. ............... 257/530 |
| 5,883,409 A | 3/1999 | Guterman et al. |
| 5,897,354 A | 4/1999 | Kachelmeier |
| 5,903,059 A | 5/1999 | Bertin et al. |
| 5,915,167 A | 6/1999 | Leedy |
| 5,929,478 A | 7/1999 | Parris et al. |
| 5,937,318 A | 8/1999 | Warner, Jr. et al. |
| 5,952,671 A | 9/1999 | Reinberg et al. |
| 5,960,539 A | 10/1999 | Burns |
| 5,969,380 A | 10/1999 | Seyyedy |
| 5,969,383 A | 10/1999 | Chang et al. |
| 5,970,372 A | 10/1999 | Hart et al. |
| 5,976,953 A | 11/1999 | Zavracky et al. |
| 5,978,258 A | 11/1999 | Manning |
| 5,985,693 A | 11/1999 | Leedy |
| 5,991,225 A | 11/1999 | Forbes et al. |
| 5,994,757 A | 11/1999 | Ohtani et al. |
| 6,021,065 A | 2/2000 | Daughton et al. |

(56) References Cited

U.S. PATENT DOCUMENTS

| | | | |
|---|---|---|---|
| 6,028,786 A | 2/2000 | Nishimura | |
| 6,034,882 A * | 3/2000 | Johnson et al. | 365/103 |
| 6,049,123 A | 4/2000 | Burns | |
| 6,051,851 A * | 4/2000 | Ohmi et al. | 257/185 |
| 6,055,180 A | 4/2000 | Gudesen et al. | |
| 6,057,598 A | 5/2000 | Payne et al. | |
| 6,072,234 A | 6/2000 | Camien et al. | |
| 6,087,722 A | 7/2000 | Lee et al. | |
| 6,111,302 A | 8/2000 | Zhang et al. | |
| 6,124,154 A | 9/2000 | Miyasaka | |
| 6,133,640 A | 10/2000 | Leedy | |
| 6,140,676 A * | 10/2000 | Lancaster | 257/315 |
| 6,150,705 A | 11/2000 | Chen | |
| 6,160,276 A | 12/2000 | Mohsen | |
| 6,185,122 B1 | 2/2001 | Johnson et al. | |
| 6,197,641 B1 | 3/2001 | Hergenrother et al. | |
| 6,208,545 B1 | 3/2001 | Leedy | |
| 6,237,064 B1 | 5/2001 | Kumar et al. | |
| 6,281,042 B1 | 8/2001 | Ahn et al. | |
| 6,291,836 B1 * | 9/2001 | Kramer et al. | 257/50 |
| 6,291,858 B1 | 9/2001 | Ma et al. | |
| 6,307,257 B1 | 10/2001 | Huang et al. | |
| 6,314,013 B1 | 11/2001 | Ahn et al. | |
| 6,322,903 B1 | 11/2001 | Siniaguine et al. | |
| 6,323,536 B1 | 11/2001 | Cutter et al. | |
| 6,324,093 B1 | 11/2001 | Perner et al. | |
| 6,337,521 B1 | 1/2002 | Masuda | |
| 6,351,028 B1 | 2/2002 | Akram | |
| 6,351,406 B1 | 2/2002 | Johnson et al. | |
| 6,353,265 B1 | 3/2002 | Michii | |
| 6,355,501 B1 | 3/2002 | Fung et al. | |
| 6,385,074 B1 | 5/2002 | Johnson et al. | |
| 6,420,215 B1 | 7/2002 | Knall et al. | |
| 6,436,818 B1 | 8/2002 | Hu et al. | |
| 6,444,507 B1 | 9/2002 | Miyasaka | |
| 6,483,736 B2 | 11/2002 | Johnson et al. | |
| 6,486,065 B2 | 11/2002 | Vyvoda et al. | |
| 6,515,888 B2 | 2/2003 | Johnson et al. | |
| 6,525,949 B1 | 2/2003 | Johnson | |
| 6,525,953 B1 | 2/2003 | Johnson | |
| 6,541,312 B2 | 4/2003 | Vyvoda et al. | |
| 6,624,525 B2 | 9/2003 | Anezaki et al. | |
| 6,631,085 B2 | 10/2003 | Kleveland et al. | |
| 6,645,870 B2 | 11/2003 | Negishi et al. | |
| 6,653,712 B2 | 11/2003 | Knall et al. | |
| 6,653,733 B1 | 11/2003 | Gonzalez et al. | |
| 6,664,639 B2 | 12/2003 | Cleeves | |
| 6,689,644 B2 | 2/2004 | Johnson | |
| 6,703,652 B2 | 3/2004 | Van Brocklin et al. | |
| 6,704,235 B2 | 3/2004 | Knall et al. | |
| 6,709,945 B2 | 3/2004 | McClure | |
| 6,768,661 B2 | 7/2004 | Vyvoda et al. | |
| 6,777,773 B2 | 8/2004 | Knall | |
| 6,780,683 B2 | 8/2004 | Johnson et al. | |
| 6,780,711 B2 | 8/2004 | Johnson et al. | |
| 6,853,049 B2 | 2/2005 | Herner | |
| 6,952,043 B2 | 10/2005 | Vyvoda et al. | |
| 6,956,278 B2 | 10/2005 | Herner | |
| 7,157,314 B2 | 1/2007 | Subramanian et al. | |
| 7,160,761 B2 | 1/2007 | Cleeves et al. | |
| 7,190,602 B2 | 3/2007 | Johnson et al. | |
| 7,265,000 B2 | 9/2007 | Subramanian et al. | |
| 7,283,403 B2 | 10/2007 | Johnson | |
| 7,319,053 B2 | 1/2008 | Subramanian et al. | |
| 7,488,625 B2 | 2/2009 | Knall | |
| 7,511,352 B2 | 3/2009 | Vyvoda | |
| 2001/0033030 A1 | 10/2001 | Leedy | |
| 2001/0054759 A1 | 12/2001 | Nishiura | |
| 2002/0024146 A1 | 2/2002 | Furusawa | |
| 2002/0027257 A1 | 3/2002 | Akram | |
| 2002/0030262 A1 | 3/2002 | Akram | |
| 2002/0030263 A1 | 3/2002 | Akram | |
| 2002/0100943 A1 | 8/2002 | Ogata et al. | |
| 2003/0026157 A1 | 2/2003 | Knali et al. | |
| 2003/0062594 A1 | 4/2003 | Chen | |
| 2004/0089917 A1 | 5/2004 | Knall | |
| 2004/0108573 A1 | 6/2004 | Herner | |
| 2008/0119027 A1 | 5/2008 | Subramanian et al. | |
| 2011/0019467 A1 | 1/2011 | Johnson | |

FOREIGN PATENT DOCUMENTS

| | | |
|---|---|---|
| EP | 0 176 078 | 4/1986 |
| EP | 0 387 834 | 9/1990 |
| EP | 0 395 886 | 11/1990 |
| EP | 0 516 866 | 12/1992 |
| EP | 0 606 653 | 7/1994 |
| EP | 0 644 548 | 3/1995 |
| EP | 0 666 593 | 8/1995 |
| EP | 0 800 137 | 10/1997 |
| JP | 60-22352 | 2/1985 |
| JP | 61222216 | 10/1986 |
| JP | 63-52463 | 3/1988 |
| WO | WO 94/26083 | 11/1994 |
| WO | WO 99/14763 | 3/1999 |
| WO | WO 00/30118 | 5/2000 |

OTHER PUBLICATIONS

Final Office Action of U.S. Appl. No. 10/689,187 mailed on Apr. 17, 2006.

Chiang, Steve et al., "Antifuse Structure Comparison for Field Programmable Gate Arrays", IEDM 92-611 (Apr. 1992), pp. 24.6.1-24.6.4.

Hamdy, Esmat et al., "Dielectric Based Anitfuse for Logic and Memory ICs", IEDM 88 (1998), pp. 786-789.

Herner, S. Brad et al., "Polycrystalline silicon/CoSi2 Schottky diode with integrated SiO2 antifuse: a nonvolatile memory cell", Applied Physics Letters, vol. 82, No. 23, (Jun. 9, 2003), pp. 4163-4165.

Konakova, R.V. et al., "Ohmic Contacts for Microwave Diodes", Proc. 22nd International Conference on Microelectronics (MIEL 2000), vol. 2, NIS, Serbia, May 14-17, 2000 (Jan. 1999) pp. 477-480.

Shih, Chih-Ching et al., "Characterization and Modeling of a Highly Reliable Metal-to-Metal Antifuse for High-Performance and High-Density Field Programmable Gate Arrays", 1997 IEEE (Sep. 1997), pp. 25-33.

Wang, Shoue-Jen et al., "High-Performance Metal/Silicide Antifuse", IEEE Electron Device Letters, vol. 13, No. 9, Sep. 1992, pp. 471-472.

Mayer et al., "Electronic Materials Science: For Integrated Circuits in Si and GaAs" (1990), Macmillan Publishing Company, pp. 294-295.

Oct. 17, 2006 Appeal Brief of U.S. Appl. No. 10/689,187.

Notification of Non-Compliant Appeal Brief of U.S. Appl. No. 10/689,187 mailed Dec. 1, 2006.

Dec. 22, 2006 Appeal Brief of U.S. Appl. No. 10/689,187.

Examiner's Answer to Appeal Brief of U.S. Appl. No. 10/689,187 mailed Mar. 29, 2007.

May 29, 2007 Reply Brief of U.S. Appl. No. 10/689,187.

Notification of Non-Compliant Appeal Brief of U.S. Appl. No. 10/689,187 mailed Mar. 6, 2008.

Apr. 7, 2008 Amended Appeal Brief of U.S. Appl. No. 10/689,187.

Examiner's Answer to Appeal Brief of U.S. Appl. No. 10/689,187 mailed Dec. 31, 2008.

Feb. 16, 2009 Reply Brief of U.S. Appl. No. 10/689,187.

Decision on Appeal of related U.S. Appl. No. 10/689,187 mailed Oct. 20, 2011.

Douglas, John H. "The Route to 3-D Chips" High Technology, Sep. 1983, vol. 3, No. 9, pp. 55-59.

Akasaka, Yoichi, "Three-Dimensional Integrated Circuit: Technology and Application Prospect," Microelectronics Journal, vol. 20 No. 1-2, 1989, pp. 105-111.

Akasaka, Yoichi, "Three-Dimensional IC Trends," Proceedings of the IEEE, vol. 74, No. 12, Dec. 1986, pp. 1703-1714.

C. de Graaff, et al., "A Novel High-Density Low-Cost Diode Programmable Read Only Memory" IEDM 96 (1996), pp. 189-192.

Notice of Abandonment of related U.S. Appl. No. 10/689,187 mailed Jan. 10, 2012.

Notice of Allowance of related U.S. Appl. No. 12/899,634 mailed Feb. 24, 2012.

(56) References Cited

OTHER PUBLICATIONS

Johnson et al., U.S. Appl. No. 13/526,671, filed Jun. 19, 2012.
Submission of Prior Art Under 37 C.F.R. § 1.501 related to U.S. Appl. No. 12/899,634, now Patent No. 8,208,282.
Schlaeppi, H.P., "Microsecond Core Memories Using Multiple Coincidence," IRE Transactions on Electronic Computers, Jun. 1960, pp. 192-198.
Schlaeppi, H.P., "Microsecond Core Memories Using Multiple Coincidence," 1960 International Solid-State Circuits Conference, Digest of Technical Papers, Feb. 11, 1960, pp. 54-55.
Sakamoto, Koji, "Architecture of Three Dimensional Devices," Bulletin of the Electrotechnical Laboratory, vol. 51, No. 1, 1987, pp. 16-29.
Kawashima et al., "A Charge-Transfer Amplifier and an Encoded-Bus Architecture for Low-Power SRAM's", IEEE Journal of Solid-State Circuits, 33, No. 5, 793-799 (1998).
Frohman-Bentchkowsky, Dov, "A Fully Decoded 2048-Bit Electrically Programmable FAMOS Read-Only Memory" IEEE Journal of Solid-State Circuits, vol. sc-6, No. 5, Oct. 1971, pp. 301-306.
Sato, Noriaki et al., "A New Programmable Cell Utilizing Insulator Breakdown"; International Electronics Devices Meeting, 1985 IC Development Division, Fujitsu Limited Nakahara-ku, Kawasaki 211, Japan; pp. 639-642.
Bertin, Claude L., "Evaluation of a Three-Dimensional Memory Cube System," IEEE Transactions on Components, Hybrids, and Manufacturing Technology, vol. 16, No. 8, Dec. 1993, 1006-1011.
Camperi-Ginestet, C., "Vertical Electrical Interconnection of Compound Semiconductor Thin-Film Devices to Underlying Silicon Circuitry," IEEE Photonics Technology Letters, vol. 4, No. 9, Sep. 1992, pp. 1003-1006.
Hayashi, Y., "A New Three Dimensional IC Fabrication Technology, Stacking Thin Film Dual CMOS Layers," IEDM 1991, pp. 657-660.
Hayashi, Fumihiko, "A Self-Aligned Split-Gate Flash EEPROM Cell with 3-D Pillar Structure" 1999 Symposium on VLSI Technology Digest of Technical Papers, pp. 87-88.
"3-D Chip-on-Chip Stacking," Industry News, Semiconductor International, Dec. 1991.
Inoue, Y., "A Three-Dimensional Static RAM," IEEE Electron Device Letters, vol. Edl.-7, No. 5, May 1986, pp. 327-329.
Jokerst, N.M., "Manufacturable Multi-Material Integration Compound Semiconductor," SPIE—The International Society for Optical Engineering, vol. 2524, Jul. 11-12, 1995, pp. 152-163.
Kurokawa, Takakazu, "3-D VLSI Technology in Japan and an Example: A Syndrome Decoder for Double Error Correction," Future Generations Computer Systems 4, No. 2, Sep. 1988, pp. 145-155.
Lay, Richard W., "TRW Develops Wireless Multiboard Interconnect System," Electronic Engineering Times, Nov. 5, 1984.
Maliniak, David, "Memory-Chip Stacks Send Density Skyward," Electronic Design 42, No. 17, Aug. 22, 1994, pp. 69-75.
Pein, Howard, et al., "Performance of the 3-D PENCIL Flash EPROM Cell and Memory Array," IEEE Transactions on Electron Devices, vol. 42, No. 11, Nov. 1995, pp. 1982-1991.
Reber, M., et al., "Benefits of Vertically Stacked Integrated Circuits for Sequential Logic," IEEE 1996, pp. 121-124.
Stacked Memory Modules, IBM Technical Disclosure Bulletin, May 1995, pp. 433-434.
Stern, Jon M., "Design and Evaluation of an Epoxy Three-Dimensional Multichip Module," IEEE Transactions on Components, Packaging, and Manufacturing Technology—Part B, vol. 19, No. 1, Feb. 1996, pp. 188-194.
Terrill, Rob, "3D Packaging Technology Overview and Mass Memory Applications," IEEE 1996, pp. 347-355.
Thakur, Shashidhar, "An Optimal Layer Assignment Algorithm for Minimizing Crosstalk for Three Layer VHV Channel Routing," IEEE 1995, pp. 207-210.
Watanabe, H., "Stacked Capacitor Cells for High-Density Dynamic RAMs," IEDM 1988, pp. 600-603.
Yamazaki, K., "Fabrication Technologies for Dual 4-Kbit stacked SRAM," IEDM 1986, pp. 435-438.
"Multilayered Josephson Junction Logic and Memory Devices," Lomatch, S; Rippert, E.D.; Ketterson, J.B., Proceedings of the SPIE—The International Society for Optical Engineering vol. 2157 p. 332-343, Jan. 1994.
"Advanced Cell Structures for Dynamic RAMs," Lu, N.C.C.: IEEE Circuits and Devices Magazine, vol. 5 No. 1 p. 27-36 Jan. 1989.
"Wide Application of Low-Cost Associative Processing Seen," Electronic Engineering Times, p. 43, Aug. 26, 1996.
"Interconnects & Packaging," Electronic Engineering Times, p. 43, Jun. 24, 1996.
"Closing in on Gigabit DRAMs," Electronic Engineering Times, p. 035, Nov. 27, 1995.
"Module Pact Pairs Cubic Memory with VisionTek," Semiconductor Industry & Business Survey, v17, n15, pN/A Oct. 23, 1995.
"Layers of BST Materials Push Toward 1Gbit DRAM" Electronics Times, p. 10, Oct. 19, 1995.
"Technologies Will Pursue Higher DRAM Densities," Electronic News (1991), p. 12 Dec. 5, 1994.
"Looking for Diverse Storage," Electronic Engineering Times, p. 44 Oct. 31, 1994.
"Special Report: Memory Market Startups Cubic Memory: 3D Space Savers," Semiconductor Industry & Business Survey, v16, n13, pN/A Sep. 12, 1994.
"Technique Boosts 3D Memory Density," Electronic Engineering Times p. 16 Aug. 29, 1994.
"Memory Packs Poised for 3D Use," Electronic Engineering Times p. 82 Dec. 7, 1992.
"MCMs Hit the Road," Electronic Engineering Times p. 45 Jun. 15, 1992.
"IEDM Ponders the "Gigachip" Era," Electronic Engineering Times, p. 33 Jan. 20, 1992.
"Tech Watch: 1-Gbit DRAM in Sight," Electronic World News, p. 20 Dec. 16, 1991.
"MCMs Meld into Systems," Electronic Engineering Times p. 35 Jul. 22, 1991.
"Systems EEs see Future in 3D," Electronic Engineering Times p. 37 Sep. 24, 1990.
Office Action of U.S. Appl. No. 10/689,187 mailed on Jan. 21, 2005.
Apr. 4, 2005 Reply to Jan. 21, 2005 Office Action of U.S. Appl. No. 10/689,187.
Final Office Action of U.S. Appl. No. 10/689,187 mailed on Jun. 9, 2005.
Aug. 16, 2005 Reply filed to Jun. 9, 2005 Final Office Action of U.S. Appl. No. 10/689,187.
Office Action of U.S. Appl. No. 10/689,187 mailed on Nov. 16, 2005.
Feb. 2, 2006 Reply to Nov. 16, 2005 Office Action of U.S. Appl. No. 10/689,187.
Semiconductor International, "3D-ROM—A First Practical Step Towards 3D-IC" [online] [retrieved on Nov. 27, 2012] retrieved from the Internet: <URL: http://www.3d-rom.net/3D-ROM/3D-ROM%20-%20A%20First%20Practical%20Step%.
"Three-Dimensional Read-Only Memory (3D-ROM)" [online] [retrieved on Nov. 27, 2012] retrieved from the Internet: <URL: http://www.3d-rom.net/3D-ROM/3D-ROM.htm.
Cappelleti et al., "Flash Memories", Kluwer Academic Publishers, Table of Contents, pp. 47, pp. 308 (1999).

* cited by examiner

SILICON NITRIDE ANTIFUSE FOR USE IN DIODE-ANTIFUSE MEMORY ARRAYS

CROSS-REFERENCE TO RELATED APPLICATIONS

This application is a continuation-in-part of Knall et al., U.S. patent application Ser. No. 10/153,999, "Three Dimensional Memory Array and Method of Fabrication" (hereinafter the '999 application, this application is a divisional of U.S. patent application Ser. No. 09/814,727, now U.S. Pat. No. 6,420,215; which is a continuation-in-part of U.S. patent application Ser. No. 09/560,626, filed Apr. 28, 2000, and since abandoned); Johnson, U.S. patent application Ser. No. 10/128,188, "Vertically-stacked, Field-Programmable, Nonvolatile Memory and Method of Fabrication" (hereinafter the '188 application, this application is a divisional of U.S. patent application Ser. No. 09/928,536, now U.S. Pat. No. 6,525,953); and Knall, U.S. patent application Ser. No. 10/186,359, "Memory Cell with Antifuse Layer Formed at Diode Junction" (hereinafter the '359 application, this is itself a continuation-in-part of U.S. patent application Ser. No. 09/638,428, now abandoned) which are all hereby incorporated by reference in their entirety.

This application is related to co-pending U.S. application Ser. No. 10/611,245 by S. Brad Herner, entitled "Low-Density, High-Resistivity Titanium Nitride Layer for use as a Contact for Low-Leakage Dielectric Layers," filed on even date herewith, which application is hereby incorporated by reference in its entirety.

BACKGROUND OF THE INVENTION

Antifuses are known elements in semiconductor devices. An antifuse separates a conductor or semiconductor from another conductor or semiconductor, and is characterized by having two states. Initially electrically insulating, when an antifuse is subjected to a high current, it ruptures and becomes conductive, and remains so.

These two distinct states make an antifuse useful in a nonvolatile memory cell. A cell containing, or isolated from a conductor by, an antifuse in an intact, insulating state may be considered to correspond to a zero or a one, while the same cell with a ruptured, conductive antifuse corresponds to the opposite value. This state remains whether power is applied to the device or not.

Antifuses can be made of a variety of materials. A common choice has been intrinsic silicon, as in Kimura et al., U.S. Pat. No. 5,311,039. Silicon dioxide and other oxides have been used as well, as in Rioult, U.S. Pat. No. 3,787,822.

Silicon nitride has been a less frequent choice. Silicon nitride antifuses, however, become particularly advantageous when used in certain structures or paired with certain materials.

SUMMARY OF THE INVENTION

The present invention is defined by the following claims, and nothing in this section should be taken as a limitation on those claims. In general, the invention is directed to the use of silicon nitride antifuses in diode-antifuse memory arrays.

A first aspect of the invention provides for a memory array comprising a plurality of memory cells, each memory cell comprising a first diode portion; a second diode portion vertically above the first diode portion; and a silicon nitride antifuse in contact with the first or the second diode portion.

Another aspect of the invention provides for a memory array comprising a plurality of memory cells, each memory cell comprising a first diode portion; a second diode portion wherein the first or the second diode portion comprises in-situ doped polysilicon; and a dielectric-rupture antifuse comprising silicon nitride in contact with the second diode portion.

An embodiment of the invention provides for a monolithic three dimensional memory array comprising first conductors extending in a first direction at a first height above a substrate; second conductors extending in a second direction at a second height above the substrate, wherein the second direction is different from the first direction; and antifuses comprising silicon nitride.

Still another aspect of the invention provides for a monolithic three dimensional memory array comprising memory cells, each memory cell comprising a first diode portion; a second diode portion; and an antifuse comprising silicon nitride.

Each of the aspects of the invention and preferred embodiments can be used alone or in combination with one another.

The preferred embodiments will now be described with reference to the attached drawings.

DETAILED DESCRIPTION OF THE INVENTION

There are many types of nonvolatile memory cells, some of which incorporate, for example, transistors, tunnel junctions, etc. Among the types of nonvolatile memory cells are diode-antifuse memory cells.

A diode allows current to flow more easily in one direction than the other. Two types of diodes commonly used in diode-antifuse memories are PN diodes and Schottky diodes. In a PN diode, p-type semiconductor material is adjacent to n-type semiconductor material. Silicon is the most commonly used semiconductor material. A Schottky diode is formed when a semiconductor material is adjacent to a metal.

In some configurations, an antifuse can separate diode portions. The diode portions become a diode when the antifuse is ruptured. Diode portions separated by an intact antifuse can be termed an incipient diode. An antifuse separating diode portions is used in the '999 application, the '188 application, and in the '359 application; the present application claims priority from all three.

An antifuse can be in series with a diode, separating it from a conductor. This approach is employed in Johnson et al., U.S. Pat. No. 6,034,882, "Vertically Stacked Field Programmable Nonvolatile Memory and Method of Fabrication," hereinafter the '882 patent; and in Herner et al., U.S. patent application Ser. No. 10/326,470 "An Improved Method for Making High Density Nonvolatile Memory," filed Dec. 19, 2002, hereinafter the '470 application; both of which are hereby incorporated by reference in their entirety.

Antifuses have been formed of a variety of materials, including intrinsic silicon and various oxides, especially silicon dioxide. Silicon nitride has been used less frequently.

Figure 1:
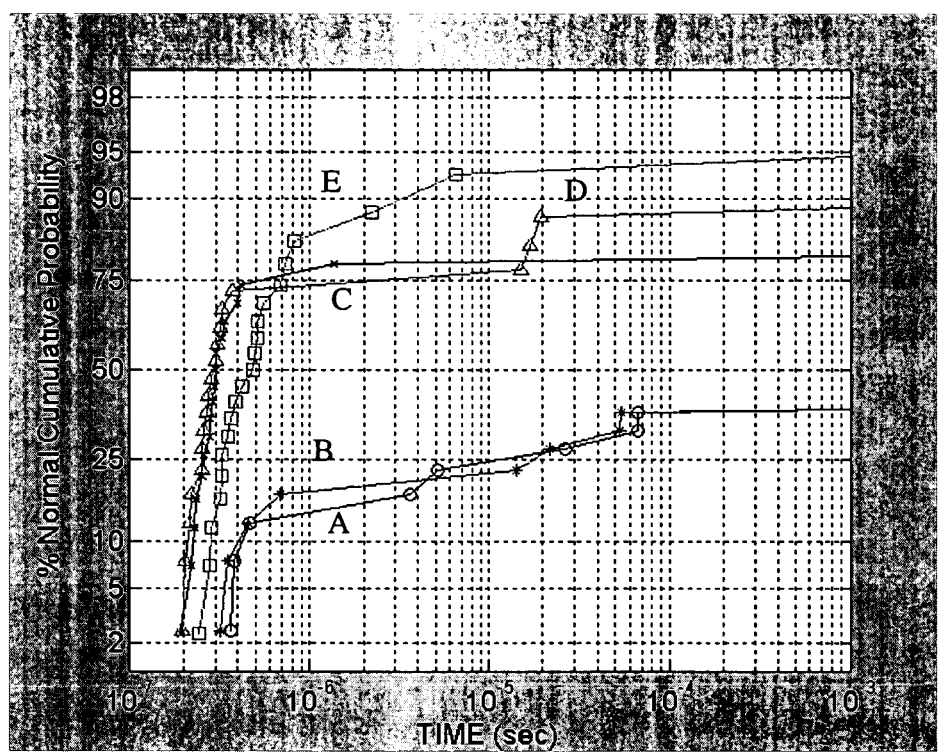
FIG. 1 is a chart showing time to rupture for antifuses formed of various materials adjacent to various contacts.

The instant invention takes advantage of silicon nitride antifuses, which rupture more quickly than silicon dioxide antifuses, allowing memory cells to be programmed faster, as shown in FIG. 1. The chart of FIG. 1 is probability plot, in which each data point is the measurement of one device on a wafer. The probability plot allows the distribution for many devices to be shown, giving statistical significance to the data. Curves A-E show time to rupture for cells formed in the same memory cell, in which an antifuse separates a diode from a conductor. Curves A and B are silicon dioxide antifuses, while curves C, D, and E are silicon nitride antifuses.

Silicon nitride antifuses can be ruptured at a lower breakdown field, thus requiring less power. Further, nitrides are not reduced as easily as oxides, enabling more materials to be used as the contacts. Titanium, for example, will reduce silicon dioxide but not silicon nitride.

Diode-antifuse memory arrays with the antifuse between the diode portions (sometimes called antifuses-at-junction) have been taught with the diode portions of the memory cell formed as a pillar, with one diode portion formed over the other, as in the '188 application. In memory arrays comprising such memory cells, any silicon dioxide antifuse could be replaced with a silicon nitride antifuse.

Diode-antifuse memory arrays with the antifuse formed in series with the diode have been taught with the diode or diode portions of the memory cell formed as a pillar, with one diode portion formed over the other, as in the '882 patent or the '470 application. In the pillar memories with an antifuse in series with a diode, for example formed on top of the diode, any silicon dioxide antifuse could be replaced with a silicon nitride antifuse.

Memory arrays including memory cells in which a silicon nitride antifuse is formed between diode portions, and in which the diode portions form parts of rail-stacks, are taught in the '999 application and the '359 application. In such memory arrays, generally a plurality of first rail-stacks formed at a first height above a substrate extend in a first direction, with dielectric fill between them. First diode portions are located in the first rail-stacks. Either a single, continuous blanket of antifuse material is formed covering the first rail-stacks and intervening dielectric fill, or the antifuse material is formed only directly on top of the first rail-stacks.

A plurality of second rail-stacks is then formed on top, at a second height above a substrate extending in a second direction, the second direction different from the first direction. Second diode portions are located in the second rail-stacks; the second diode portions are above the first diode portions. The antifuse material forms antifuses wherever first rail-stacks intersect second rail-stacks. Both first rail-stacks and second rail-stacks comprise conductors.

It should be noted that pillar memories comprise first conductors formed at a first height above a substrate extending in a first direction, and second conductors formed at a second height above a substrate extending in a second direction, the second direction different from the first direction. A pillar, including diode portions and an antifuse which may be silicon nitride, is formed wherever a vertical projection of a first conductor intersects a second conductor.

Thus both rail and pillar monolithic three dimensional memory arrays comprise first conductors formed at a first height above a substrate extending in a first direction; second conductors formed at a second height above the substrate extending in a second direction, the second direction different from the first direction; and antifuses at a third height between the first height and the second height. The antifuses may comprise silicon nitride. There may be multiple vertically stacked memory levels, for example eight levels.

The incorporated and priority documents teach, inter alia, memory cells comprising a first diode portion and a second diode portion, the second diode portion vertically above the first. In all such cells an antifuse, which may comprise silicon nitride, is in contact with the first or the second diode portion.

In cells in which the antifuse is in series with this diode, the antifuse is below the first or above the second diode portion. In antifuse-at-junction cells, the antifuse is between the diode portions. The incorporated and priority documents teach, inter alia, first diode portions comprising a semiconductor of a first conductivity type (n-type or p-type) and second diode portions comprising a semiconductor of a second conductivity type, the second conductivity type opposite the first conductivity type. The semiconductor of either type is preferably in situ doped polycrystalline silicon, also called polysilicon.

Memory arrays comprising Schottky diode portions in which a silicon nitride antifuse is interposed between a first diode portion and a second diode portion, in which the first diode portion comprises metal or metalloid and the second diode portion comprises semiconductor material, and one diode portion is located vertically above the other, are taught in the '999 application, (in which the cells are formed in rail-stacks) and the '188 application, (in which the cells are formed in pillars.)

Ideally, before rupture, no current flows across an antifuse. In reality, there is always some unwanted current, called leakage current. The leakage current associated with a silicon nitride antifuse is generally higher than, for example, that of a silicon dioxide antifuse of the same thickness. If the contact to a silicon nitride antifuse is a low-density, high-resistivity conductor, such as those described in Hemer, application number 10/611,245, leakage current across the silicon nitride antifuse is significantly reduced.

The low-density, high-resistivity conductors of Hemer, application Ser. No. 10/611,245, can be titanium nitride, tungsten nitride, tantalum nitride, titanium tungsten, tungsten, or aluminum; preferably titanium nitride. This low-density, high-resistivity titanium nitride has a resistivity greater than about 300 microOhm-cms, preferably greater than about 500 microOhm-cms, more preferably greater than about 1000 microOhm-cms. Its density is less than about 4.25 grams/cm$^3$, preferably less than about 4.00 grams/cm$^3$, preferably about 3.98 grams/cm$^3$. For the other materials named, the density is less than about 75 percent of the theoretical density for the metal or metalloid.

Accordingly, in a preferred embodiment, a low-density, high-resistivity conductor, preferably titanium nitride, is paired with a silicon nitride antifuse by positioning the silicon nitride antifuse adjacent to a metal or metalloid. Such a contact can be formed in a Schottky diode in which the antifuse is interposed between the metal and the semiconductor, as described earlier. The metal or metalloid contact adjacent to the silicon nitride antifuse can be formed of low-density, high-resistivity conductor.

In another embodiment, a low-density, high-resistivity conductor is paired with a silicon nitride antifuse which separates a PN diode from the conductor, as in Herner, application Ser. No. 10/611,245. These devices can be vertically stacked in multiple levels to form monolithic three dimensional memory arrays.

Figure 2:
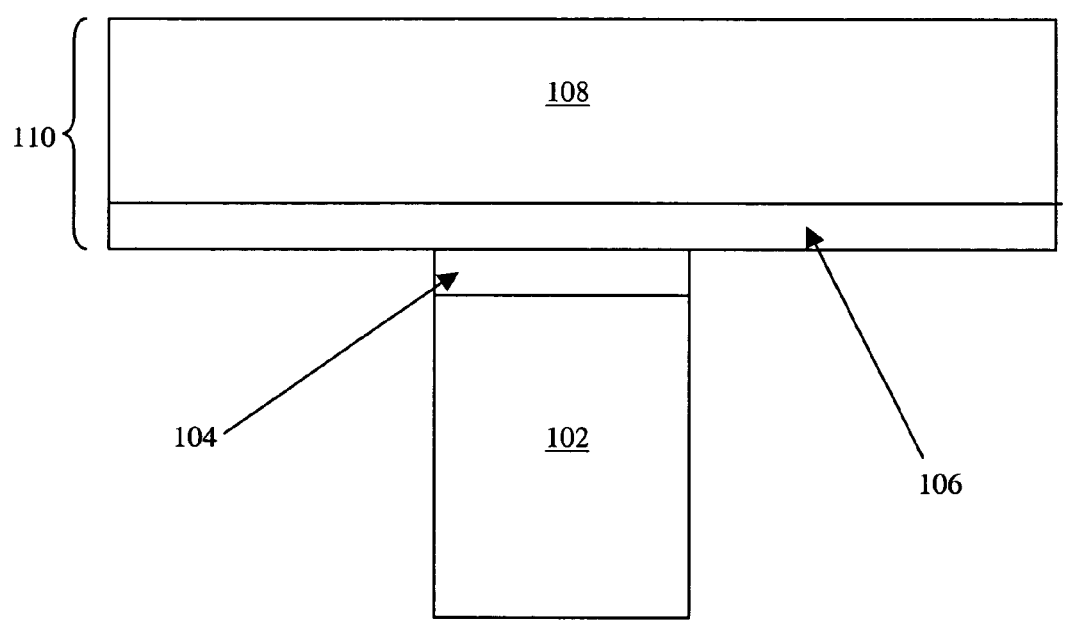
FIG. 2 is a cross-section of a memory cell employing a silicon nitride antifuse in contact with a low-density, high-resistivity layer formed according to an aspect of the present invention.

A detailed example of a memory array using a silicon nitride antifuse, illustrated in FIG. 2, will be given. The '470 application teaches a PN diode formed in a pillar, with a first diode portion of one conductivity type, and a second diode portion of the opposite conductivity type formed on top of it. An antifuse 104 on top of the pillar PN diode 102 separates it from an overlying conductor 110. The antifuse layer 104 can be formed of silicon nitride instead of silicon dioxide. This is preferably done by forming the PN diode 102 according to the teachings of the '470 application, and filling and planarizing to expose the top of PN diode 102. Next, silicon nitride is thermally grown, for example by a rapid thermal annealing at 750 to 800 degrees Celsius, flowing 4 liters/minute of $NH_3$ for 60 seconds at atmospheric pressure, with a temperature ramp rate of 50 degrees C. per second, forming a layer of silicon nitride preferably about 23 angstroms thick. The silicon nitride layer could be deposited instead. This layer of silicon nitride serves as antifuse 104. The low-density, high-resistivity titanium nitride layer 106 is formed next, with tungsten layer 108 above it.

Figure 3:
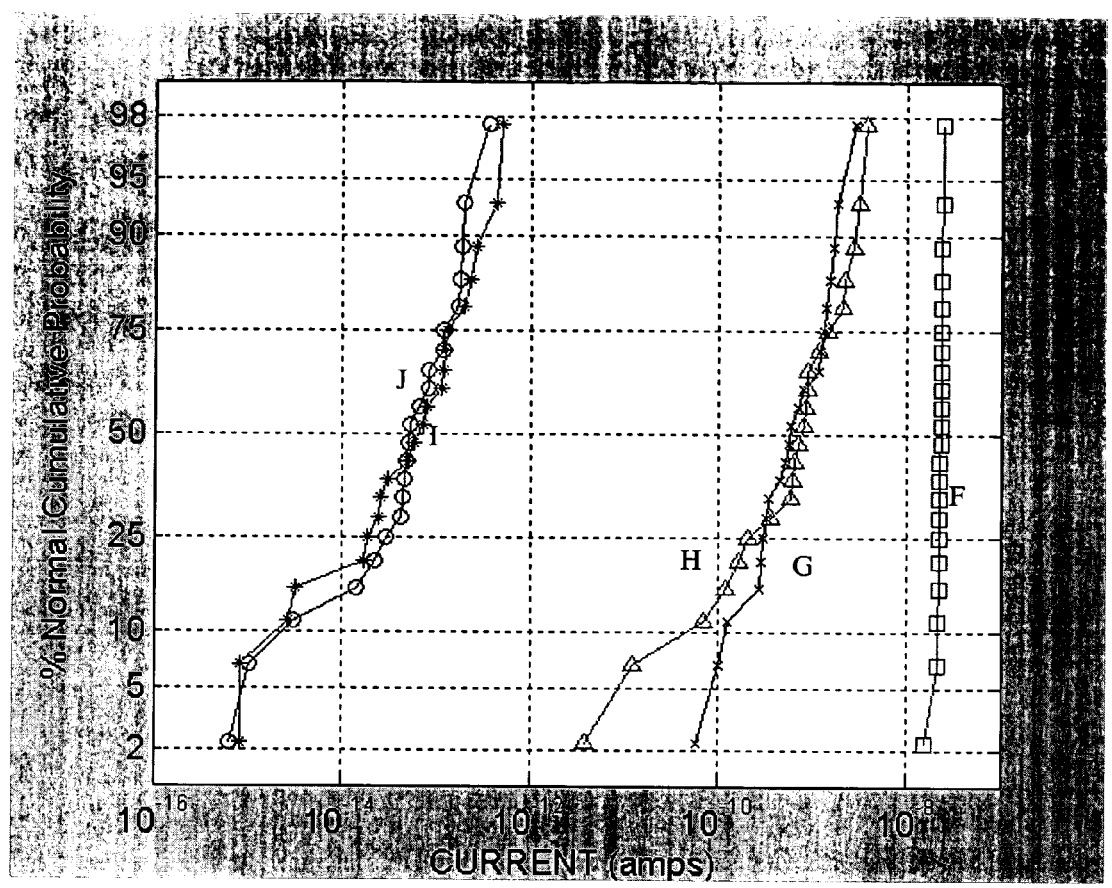
FIG. 3 is a chart showing leakage current for antifuses formed of various materials adjacent to various contacts.

When low-density, high-resistivity titanium nitride is used adjacent to the silicon nitride antifuse, the pre-rupture leakage current across the antifuse is less than when conventionally-formed titanium nitride is used, as shown in FIG. 3.

The layer of titanium nitride in this example is adjacent to a silicon nitride antifuse, which is intended, before rupture, to allow minimal leakage current. The antifuse has a roughly circular shape with a diameter of about 0.15 µm. The cross-sectional area for which the leakage is measured, then, is:

$$\pi \times ((0.15 \text{ µm})/2)^2 = 0.0177 \text{ µm}^2$$

In this case the median leakage current with a voltage lower than the rupture voltage applied across the antifuse was significantly less when the silicon nitride antifuse was paired with low-density, high-resistivity titanium nitride, shown in FIG. 3 on curves G (formed at 750 degrees C.) and H (formed at 800 degrees C.), than when the silicon nitride antifuse was in contact with conventional, dense titanium nitride, shown on curve F. The antifuses in curves I and J were made of silicon dioxide, which has still less leakage.

Figure 4:
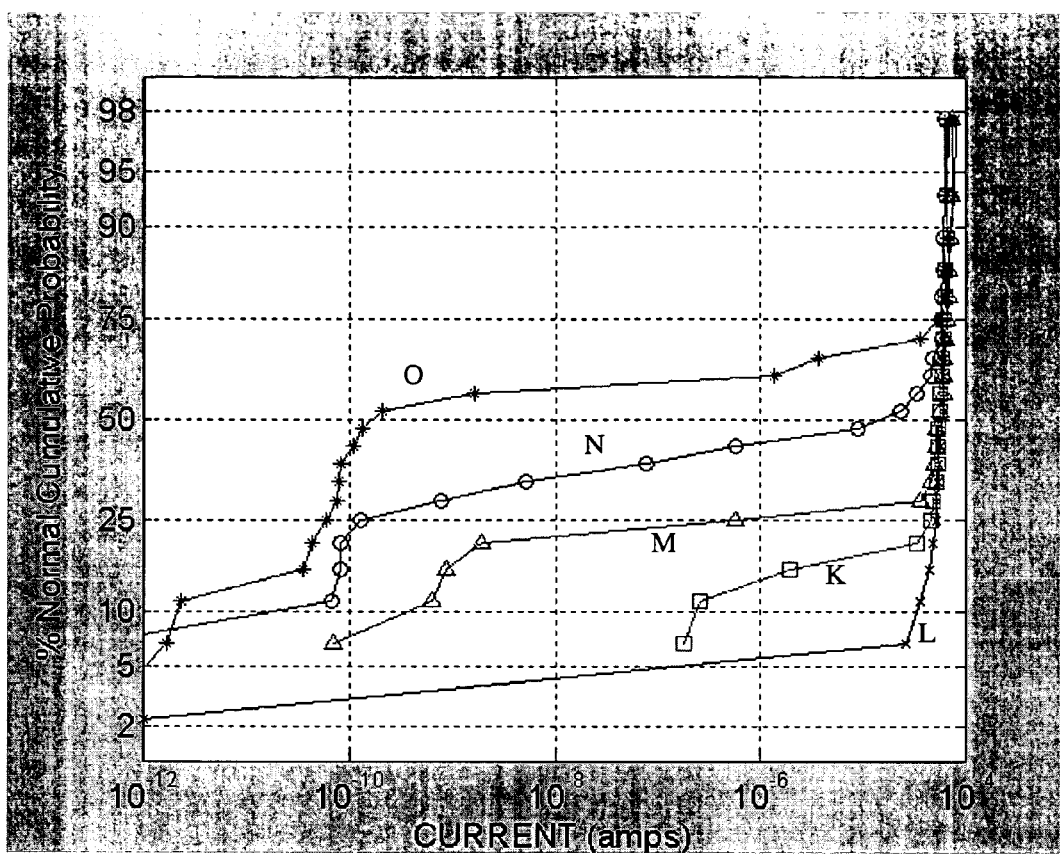
FIG. 4 is a chart showing programmed current for antifuses formed of various materials adjacent to various contacts.

After antifuse rupture, higher current is preferred for device performance, and the forward current after rupture is as large or larger than when standard titanium nitride is used, as shown in FIG. 4. Conventional, denser titanium nitride was used with a silicon nitride antifuse on curve K, while low-density, high-resistivity titanium nitride was used with a silicon nitride antifuse on curve L (grown at 750 deg. C.) and M (grown at 800 deg. C.) Curves N and O show silicon dioxide antifuses used with low-density, high-resistivity titanium nitride.

As described in the '470 application, in preferred embodiments the top of the diode is heavily doped polysilicon, which provides a good ohmic contact after antifuse rupture. Some of this layer is lost during the planarization performed before growth of the antifuse. If too much heavily doped polysilicon is lost, forward current is decreased, which can hinder device performance. It will be observed that on curves N and O in FIG. 4, which have silicon dioxide antifuses, that several devices have unacceptably low forward current, while fewer devices with silicon nitride antifuses display this poor performance. Thus silicon nitride antifuses are more tolerant of varied doping conditions at the top of the diode.

While devices using silicon dioxide antifuses have an even bigger difference between pre-rupture leakage current and post-rupture forward current than do those using silicon nitride antifuses, the pre- and post-rupture difference for silicon nitride antifuses in contact with low-density, high-resistivity conductive layer is more than adequate for most uses.

Figure 5:
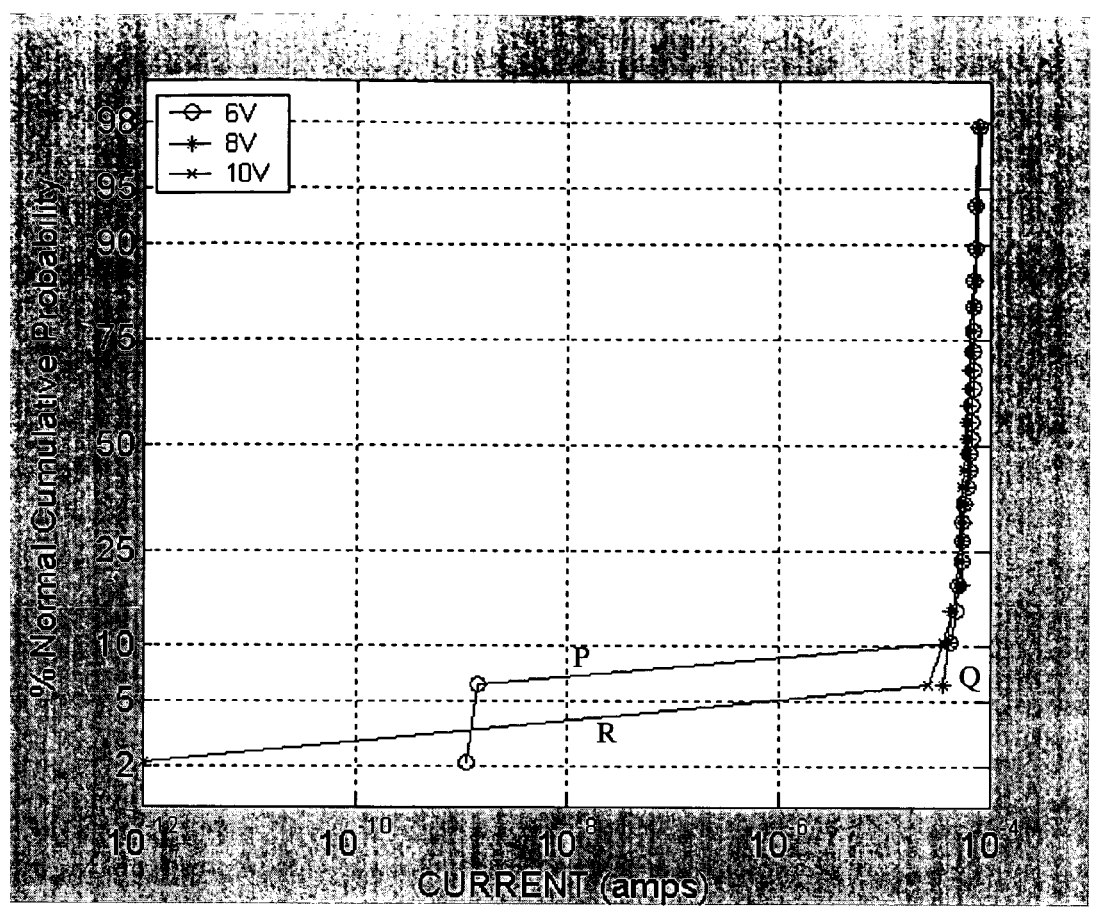
FIG. 5 is a chart showing programmed current for silicon-nitride antifuse devices programmed with various programming voltages.

As mentioned earlier, antifuses formed of silicon nitride can be ruptured at a lower breakdown field, thus requiring less power. In the device described in the '470 application, for example, in top antifuse embodiments when the diameter of the diode is about 0.15 µm, a voltage of about 10 volts is required to reliably rupture antifuses formed of silicon dioxide. When silicon nitride antifuses are used in the same device at the same diode diameter, the antifuse can be ruptured at lower voltages, for example 6-8 volts. FIG. 5 illustrates forward current after programming with 2 volts applied for the device of the '470 application when the device was programmed at 6 volts (curve P), 8 volts (curve Q), and 10 volts (curve R.) The antifuse for all three curves was silicon nitride grown at 750 deg. C. As will be seen, the forward current is virtually indistinguishable whether 10 volts or 6 volts was used to program the device. This allows memory cells to be scaled to smaller devices, as lower voltages allow smaller programming transistors to be used.

Accordingly, the inventors of the instant application have found it advantageous to trade off the larger programmed versus unprogrammed current differential of silicon dioxide antifuses in favor of the faster and lower-power rupture of silicon nitride antifuses in many applications.

In addition to the earlier incorporated patents and applications, monolithic three dimensional memories are described in Johnson, U.S. Pat. No. 6,525,953, "Vertically Stacked Field Programmable Nonvolatile Memory and Method of Fabrication"; Knall et al., U.S. Pat. No. 6,420,215, "Three Dimensional Memory Array and Method of Fabrication"; and Vyvoda, U.S. patent application Ser. No. 10/440,882, "Rail Schottky Device and Method of Making," filed May 19, 2003, all assigned to the assignee of the present invention and herein incorporated by reference. The memory cells in these memory arrays are diodes and incipient diodes.

In some monolithic three-dimensional memory arrays taught in these incorporated patents and applications, the memory cells comprise diode portions and antifuses. The diode portions may be found in either rails or pillars. A silicon nitride antifuse can be advantageously paired with the low-density high-resistivity material (titanium nitride, tungsten nitride, tantalum nitride, titanium tungsten, tungsten, or aluminum) described herein.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A memory array comprising a plurality of memory cells, each memory cell comprising:
    a first diode portion;
    a second diode portion; and
    a dielectric-rupture antifuse comprising silicon nitride in contact with the second diode portion,
    wherein:
    the first diode portion comprises in-situ doped polysilicon, and
    the second diode portion comprises a layer of titanium nitride in contact with the antifuse, the titanium nitride layer comprising at least a portion having a thickness greater than about 20 angstroms, wherein, for any portion of the titanium nitride layer with a thickness greater than about 20 angstroms, the titanium nitride has a density less than 4.0 grams/cm$^3$.

2. The memory array of claim 1, wherein the first diode portion or the second diode portion forms part of a rail-stack.

3. The memory array of claim 1, wherein the first diode portion or the second diode portion forms part of a pillar.

4. A monolithic three dimensional memory array comprising:
- first conductors extending in a first direction at a first height above a substrate;
- second conductors extending in a second direction at a second height above the substrate, wherein the second direction is different from the first direction; and
- antifuses comprising silicon nitride, wherein:
- the antifuses are in contact with a first metallic material, and
- the first metallic material is titanium nitride comprising at least a portion having a thickness of greater than about 20 angstroms, and for any thickness of titanium nitride greater than about 20 angstroms, the density of the titanium nitride is less than about 4.0 grams/cm$^3$ and the resistivity of the titanium nitride is greater than about 300 microOhm-cms.

5. The monolithic three dimensional memory array of claim 4 wherein the antifuses are at a third height between the first height and the second height.

\* \* \* \* \*